United States Patent
Abe

(10) Patent No.: US 8,864,011 B2
(45) Date of Patent: Oct. 21, 2014

(54) APPARATUS FOR THERMAL MELTING PROCESS AND METHOD OF THERMAL MELTING PROCESS

(75) Inventor: Hideyuki Abe, Himeji (JP)

(73) Assignee: Ayumi Industry Co., Ltd. (JP)

( * ) Notice: Subject to any disclaimer, the term of this patent is extended or adjusted under 35 U.S.C. 154(b) by 294 days.

(21) Appl. No.: 13/392,303

(22) PCT Filed: Aug. 24, 2010

(86) PCT No.: PCT/JP2010/064299
§ 371 (c)(1),
(2), (4) Date: Feb. 24, 2012

(87) PCT Pub. No.: WO2011/024813
PCT Pub. Date: Mar. 3, 2011

(65) Prior Publication Data
US 2012/0153010 A1    Jun. 21, 2012

(30) Foreign Application Priority Data

Aug. 27, 2009 (JP) ................................. 2009-196687
Nov. 5, 2009 (JP) ................................. 2009-254255

(51) Int. Cl.
*B23K 37/00* (2006.01)
*B23K 1/00* (2006.01)
*B23K 3/04* (2006.01)
*B23K 3/08* (2006.01)
*B23K 1/008* (2006.01)
*H01L 23/00* (2006.01)
*H05K 3/34* (2006.01)

(52) U.S. Cl.
CPC ..... *B23K 1/0016* (2013.01); *H01L 2924/01005* (2013.01); *H01L 2224/8121* (2013.01); *H01L 2924/01004* (2013.01); *B23K 3/04* (2013.01); *H01L 2924/01033* (2013.01); *H01L 2924/0105* (2013.01); *B23K 2201/40* (2013.01); *H01L 2924/014* (2013.01); *H01L 2924/01029* (2013.01); *B23K 2201/42* (2013.01); *H01L 2924/01006* (2013.01); *H01L 2924/01047* (2013.01); *H05K 3/3494* (2013.01); *B23K 3/087* (2013.01); *H01L 2924/01074* (2013.01); *B23K 1/008* (2013.01); *H01L 24/81* (2013.01); *H01L 2924/01082* (2013.01); *H01L 24/75* (2013.01); *H01L 2924/01019* (2013.01); *H01L 2924/0102* (2013.01)
USPC .................................. 228/42; 228/43; 228/46

(58) Field of Classification Search
USPC ......................................................... 228/219
See application file for complete search history.

(56) References Cited

U.S. PATENT DOCUMENTS 3,151,591 A * 10/1964 Burns et al. ................... 228/44.3
6,312,518 B1 * 11/2001 Kwon .............................. 118/52

(Continued)

FOREIGN PATENT DOCUMENTS

| JP | 2001-244618 A | 9/2001 |
|----|---------------|--------|
| JP | 2008-034746 A | 2/2008 |

(Continued)

OTHER PUBLICATIONS

International Preliminary Report on Patentability, Mar. 13, 2012.

*Primary Examiner* — Kiley Stoner
(74) *Attorney, Agent, or Firm* — Fox Rothschild LLP; Richard C. Woodbridge; Ryan N. Miller

(57) ABSTRACT

Provide is an apparatus for thermal melting processes that is capable of directly cooling the process object without requiring a separate cooling plate.
The apparatus for thermal melting process according to the present invention is an apparatus 1 for thermal melting process that thermally melts objects 100 including solder in an atmosphere containing carbonic acid vapor, and the hand part 4 for carrying and transferring the thermally melted process objects 100 is used as a cooling plate as well.

15 Claims, 16 Drawing Sheets

(56) References Cited

U.S. PATENT DOCUMENTS

| | | | |
|---|---|---|---|
| 6,344,407 B1 | 2/2002 | Matsuki et al. | |
| 6,375,060 B1 * | 4/2002 | Silhavy | 228/180.22 |
| 8,210,417 B2 * | 7/2012 | Akiyama et al. | 228/6.2 |
| 8,286,853 B2 * | 10/2012 | Akiyama et al. | 228/180.21 |
| 2002/0076909 A1 | 6/2002 | Matsuki et al. | |
| 2008/0026153 A1 | 1/2008 | Hayashida et al. | |
| 2009/0033352 A1 * | 2/2009 | An et al. | 324/765 |
| 2009/0173771 A1 | 7/2009 | Weber | |

FOREIGN PATENT DOCUMENTS

| | | | |
|---|---|---|---|
| JP | 2008-041980 A | | 2/2008 |
| JP | 2009-164435 A | | 7/2009 |
| JP | 2009-164523 A | | 7/2009 |
| JP | 2011-233934 A | | 11/2011 |
| KR | 2003-068291 A | * | 8/2003 |
| WO | 2007137547 A1 | | 12/2007 |

* cited by examiner

APPARATUS FOR THERMAL MELTING PROCESS AND METHOD OF THERMAL MELTING PROCESS

CROSS-REFERENCE TO RELATED APPLICATIONS

This application is the National Phase filing of PCT Application No. PCT/JP2010/064299 filed Aug. 27, 2010 and claims priority to Japanese Patent Application Number 2009-196687 filed Aug. 27, 2009 and Japanese Patent Application 2009-254255, filed Nov. 5, 2009, the disclosure of which is hereby incorporated by reference in its entirety.

TECHNICAL FIELD

The present invention relates to an apparatus for thermal melting process and a method of thermal melting process for thermally melting process objects including solder.

BACKGROUND TECHNOLOGY

Various thermal melting apparatuses such as solder processing apparatuses and solder ball forming apparatuses for thermally melting various process objects including solder have been used recently. More specifically, certain thermally melting process apparatuses have been used for enabling solder processing and solder ball forming process using carbonic acids such as formic acid instead of flux (Patent Documents 1 and 2).

It is required for these thermally melting process apparatuses to shorten the time between melting to cooling from the standpoint of improving the speed of the operation. Based on this standpoint, the apparatus disclosed by Patent Document 1 provides a cooling plate in a liftable manner beneath the heating plate having a heating means so that the cooling plate can be lifted to contact the hot plate in order to force-cool the substrate being soldered.

PRIOR ART DOCUMENTS

Patent Documents

Patent Document 1: Publication of Japanese Patent Application 11-233934
Patent Document 2: Publication of Japanese Patent Application 2001-244618

SUMMARY

Problems to be Solved by the Invention

However, in the apparatus for thermally melting process mentioned above, the cooling plate is only used to cool the hot plate where heating means is provided by closely contacting with it, not cooling the process object itself such as a substrate being soldered by closely contacting with it.

Therefore, this thermal melting process of the prior art has a problem that it is only good for cooling the process object indirectly via the hot plate, and is not capable of directly cooling the process object. Moreover, it has a problem that a separate cooling plate has to be installed in a movable manner in addition to having a transfer means to transfer the process object in and out of the chamber.

Therefore, the object of the present invention is to provide an apparatus for thermal melting processes that is capable of directly cooling the process object without requiring a separate cooling plate.

Means for Solving Problems

The apparatus for thermal melting process according to the present invention is an apparatus for thermal melting process that thermally melts objects including solder in an atmosphere containing carbonic acid vapor, and is characterized in that a hand part that is used for transferring the thermally melted process objects is used as a cooling plate as well.

The method for thermal melting process according to the present invention is characterized in that it comprises a step of thermally melting a process object including solder in an atmosphere containing carbonic acid vapor, and a step of transferring the thermally melted process object on the hand part that is also used as a cooling plate as well.

Effect of the Invention

According to the present invention, it is capable of rapid cooling and hence improves productivity because of accelerated production speed in comparison against a case of indirectly cooling the process object via a hot plate equipped with a heating means.

WORKING CONFIGURATION OF INVENTION

First Embodiment

The first embodiment of the present invention will be described below with reference to the accompanying drawings. In describing the drawings, identical elements will be identified by identical codes in order to avoid duplicating descriptions. The scaling factors of the drawings may vary from those of the actual components because of intentional exaggerations for the sake of explanations.

Figure 1:
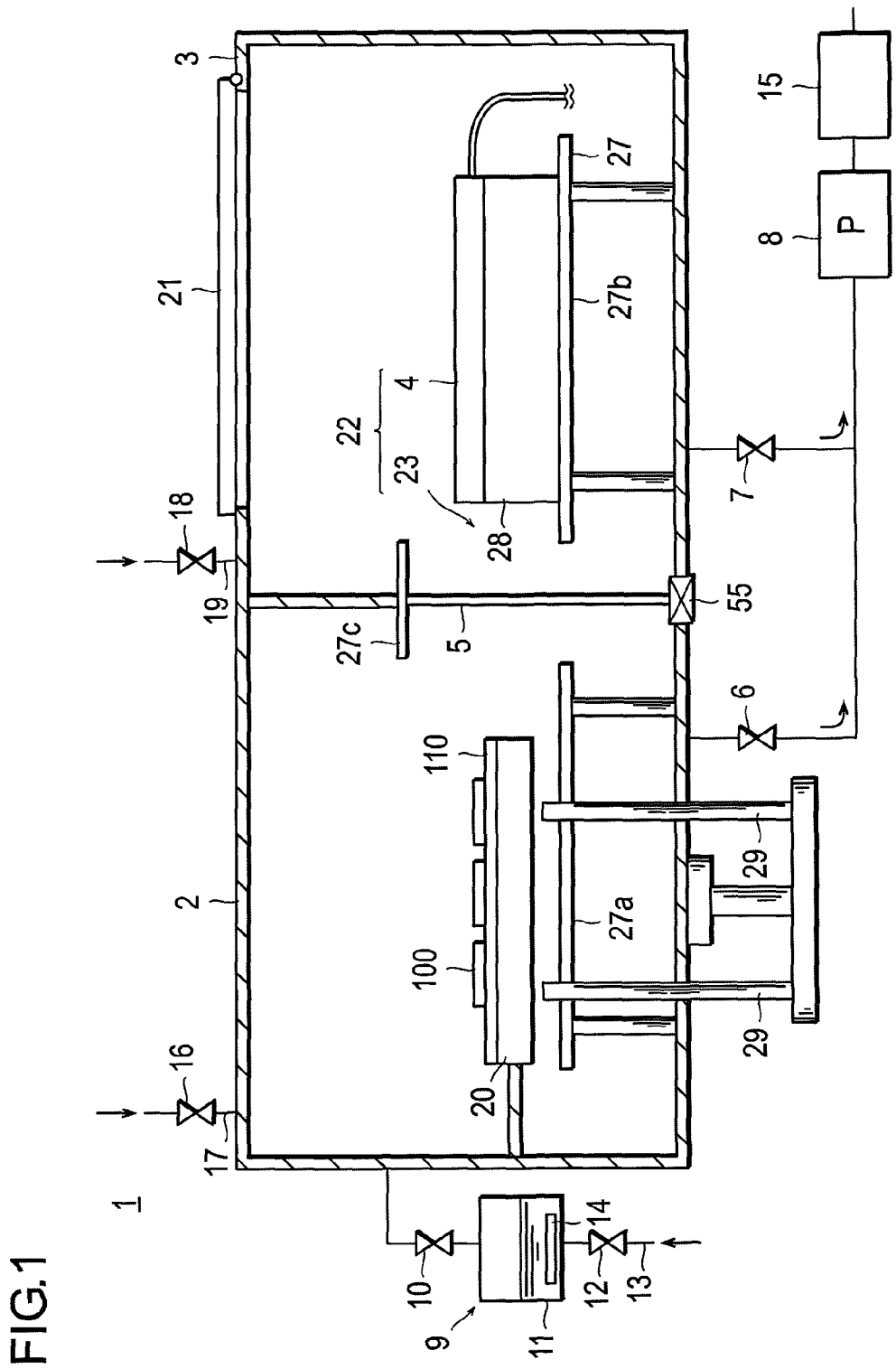
FIG. 1 is a schematic cross-sectional view of the apparatus for soldering process according to the first embodiment of the present invention.

FIG. 1 shows the first embodiment wherein the apparatus for thermal melting process according to the present invention is applied to an apparatus for soldering process. The solder processing apparatus 1 has a first chamber 2 and a second chamber 3, as well as a hand part 4 that carries thereon and transfers between the chambers a substrate to be soldered, i.e., the process object, which also serves as a cooling plate.

Here, the first chamber 2 and the second chamber 3 are connected via a gate valve 5 that opens and closes as needed. By closing the gate valve 5, the first chamber 2 and the second chamber 3 can be isolated from each other by a plate-like shield member that forms a part of the gate valve 5. Also, by opening the gate valve 5, the first chamber 2 and the second chamber 3 can conduct with each other while maintaining the sealing state of the first chamber 2 and the second chamber 3 from the outside. Here, for example, it is possible to realize such a function of the gate valve 5 as described above by sliding the shield member that forms a part of the gate valve 5 via a sealing member 55 to the inside or outside of the first chamber 2 or the second chamber 3. Such a sealing member can be constituted using, for example, an O-ring. The first chamber 2 serves as a processing chamber for soldering a substrate 100 to be soldered, i.e., an object of processes including soldering, and the second chamber 3 serves as a load-lock chamber for loading the substrate 100 to be soldered. The substrate 100 to be soldered can be a pair of chips at least one of which has a plurality of solder bumps formed on its surface, wherein a flip chip bonding process is executed for jointing the pair of chips in such a manner that they are laminated via each other's solder bumps or via solder bumps with electrodes as the soldering process. In other words, in case the flip chip bonding process is employed, solder bumps are formed on the surfaces of both the first chip and the second chip, so that the first chip and the second chip are soldered together, or solder bumps are formed on the surface of the first chip while electrode parts are formed on the surface of the second chip, so that the first chip and the second chip are soldered together via the solder bumps of the first chip and the electrode parts of the second chip.

Although a case of soldering both the first chip and the second chip was described in the above, other cases can be considered as well; for example, a case of soldering together a chip and a wafer on the surface of both of which a plurality of solder bumps is formed, or a case of soldering a plurality of wafers on the surface of which a plurality of solder bumps is formed.

<On Air Supply/Exhaust System>

First, let us describe the air supply/exhaust system to be connected to the first chamber 2 and the second chamber 3. The first chamber 2 and the second chamber 3 are each connected to an exhaust pump (vacuum pump) 8 via valves 6 and 7 respectively. The exhaust pump 8 is an exhaust means for the purpose of pressure reduction in the first chamber and the second chamber. In the present embodiment, only one exhaust pump 8 is provided as a means of exhausting the first chamber 2 and the second chamber 3, it can also be configured in such a way of having an independent exhaust pump provided for each of the chambers 2 and 3.

The first chamber 2 is connected via a valve 10 to a carbonic acid vapor supply system (carbonic acid supply means) 9 that makes it possible to solder without flux. The carbonic acids that can be used here include formic acid, acetic acid, propionic acid, butyric acid, valeric acid, capronic acid, enanthic acid, caprylic acid, pelargonic acid, oxalic acid, malonic acid, succinic acid, acrylic acid, salicylic acid, and lactic acid.

The carbonic acid vapor supply system 9 introduces carbonic acid gas mixed with carrier gas such as reducing gas like hydrogen or carbon monoxide as well as inert gas like nitrogen into the first chamber. The carbonic acid vapor supply system 9 has a sealed container 11 containing liquid carbonic acid, and the sealed container 11 is connected to a carrier gas supply tube 13 that supplies carrier gas via a valve 12. The carrier gas supply tube 13 is connected to a bubbling part 14 for causing bubbles (bubbling) inside the container 11. A heater can be provided in the vicinity of the container 11 to warm the carbonic acid liquid. The heater is intended to keep the carbonic acid liquid at a certain temperature. Thus, by using the carrier gas in addition, it is possible to make it easier for the carbonic acid vapor to be introduced into the first chamber 2, and to make it possible to prevent the carbonic acid not yet fully evaporated from adhering to the process object to develop a residue.

It is also possible, different from the present embodiment, to introduce the carbonic acid vapor into the first chamber 2 without using the carrier gas by communicating the sealed container 11 containing the carbonic acid liquid with the first chamber 2. It is also possible to configure in such a manner as to mix the carrier gas with the carbonic acid liquid in the midway of communicating the sealed container 11 containing the carbonic acid liquid with the first chamber 2. In such a case, the evaporation amount depends on the gas pressure inside the first chamber 2.

It is also possible to configure in such a manner as to provide a carbonic acid heating means (not shown) for heating carbonic acid to cause it evaporate inside the first chamber 2 and supply carbonic acid liquid to the carbonic acid heating means inside the first chamber via a supply tube (not shown). In this case, the carbonic acid heating means causes the liquid carbonic acid to be heated to evaporate inside the first chamber 2, thus to provide carbonic acid vapor atmosphere.

Next, let us describe the carbonic acid collection part. The solder processing apparatus 1 of the present embodiment has a carbonic collection part (collection mechanism) 15 for collecting the evaporated carbonic acid provided or attached to the suction or exhaust side of the exhaust pump 8. The carbonic acid collection part 15 can be a filter attached to the suction or exhaust side of the exhaust pump 8, or a scrubber attached to the exhaust side. A filter of a neutralizing type filter utilizing alkaline solid substance consisting of a mixture containing Ca(OH)2 etc., or a thermal cracking type filter that thermally cracks carbonic acid can be used as the filter in this case. Other filters, such as an adhesion type filter utilizing a molecular sieve to capture carbonic acid or a catalytic reaction type filter utilizing catalytic cracking reactions, can also be used for this purpose. On the other hand, scrubbers such as a type of scrubber that neutralizes carbonic acid in a liquid treatment, or a type of scrubber that collects evaporated carbonic acid by dissolving it into a solution, can be used for this purpose. The type of scrubber that collects evaporated carbonic acid by dissolving it into a solution has a configuration in which a first exhaust tube connected to the exhaust side of the exhaust pump is inserted into the solution in a liquid tank, and a second exhaust tube is connected to the top of the liquid tank.

Moreover, a nitrogen supply tube 16 is connected to the first chamber 2 via a valve 17 in order to replace (to purge) the inside with a nitrogen atmosphere, and another nitrogen tube 18 is connected to the second chamber 3 via a valve 19 as well.

<On Heating Means>

Next, let us describe the heating means provided in the first chamber 2.

A hot plate 20 is provided inside the first chamber 2 as a heating means. A substrate 100 to be soldered is carried on the top surface of the hot plate 20 and heated. However, it is also possible to place the substrate 100 to be soldered on the hot plate 20 via a tray plate 110 made of metal, ceramic or other materials if a large number of substrates to be soldered 100 is involved. FIG. 1 shows a case where the substrate 100 to be soldered is placed via the tray plate 110. Therefore, in the following descriptions, not only the substrate 100 to be soldered but also the tray plate 110 is described as the process object in some cases, for the sake of convenience of description.

The hot plate 20 can be configured with metal, ceramic and other materials attached with a heater, and the heater can be an electric resistance heater, e.g., a sheathed heater. However, it is more preferable to form the hot plate 20 with a plate-like member consisting of carbon from the standpoint of improving corrosion resistance and heat the process object by heating the hot plate 20 itself by running a current through the plate-like member consisting of carbon 20 itself.

<On Transfer Part>

Next, let us describe the transfer part of the apparatus for soldering process of the present embodiment.

A lid 21 is provided on the second chamber 3 for taking the process object in and out. The solder processing apparatus 1 has a transfer part (transfer means) 22 that transfers the loaded process object between the first chamber 2 and the second chamber 3.

The transfer part 22 has a hand part 4 and a transfer mechanism (transfer means) 23 for transferring the hand part 4 freely. The "hand part" in the invention of this application means a part on which the process object is placed for transferring the process object. The hand part 4 is formed as a plate-like member in the present embodiment. However, it is not limited to the particular shape, but rather various shapes can be adopted in the hand part 4. Further, in order to improve its cooling efficiency, the top surface of the hand part 4 is preferably formed flat so that it can have a close contact with the bottom surface of the substrate 100 or the tray plate 110. The hand part 4 can be made of metal, ceramic or other materials.

Figure 2:
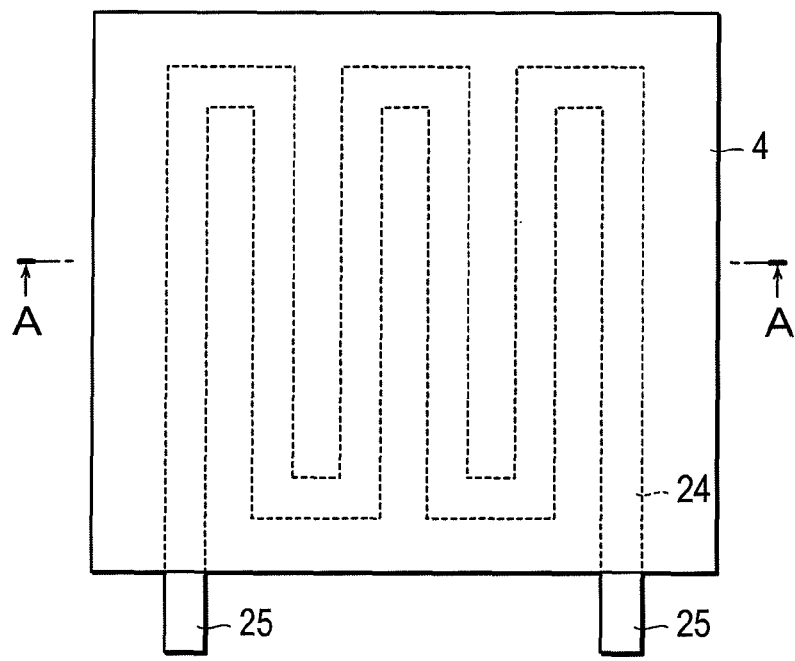
FIG. 2 shows a plan view (A) and A-A cross-sectional view (B) of the hand part of the apparatus for soldering process of FIG. 1.
Figure 2:
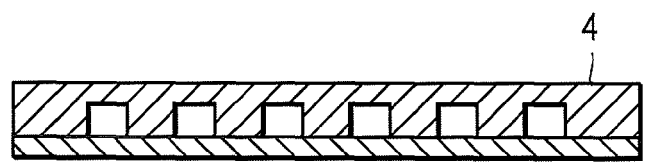

FIG. 2 shows an example of the hand part. The hand part 4 has a circulation path 24 for the cooling medium to be circulated. In the case shown in FIG. 2, the circulation path can be provided inside the hand part 4. For example, it can be so configured for the hand part to have a hand part main body in which a groove is formed as the circulation path and a lid part which is jointed to the hand part main body, so that the jointing of the hand part main body with the lid part completes the circulation path. The circulation path 24 is preferably formed in such a way that it meanders within a surface so that it can cool a wide range of the hand part 4. Contrary to the present embodiment, the circulation path 24 can be attached outside to the bottom surface, i.e., opposite to the surface on which the substrate 100 or the tray plate 110 is placed. The cooling medium that flows through the circulation path 24 can be either liquid or gas. However, the medium should preferably be liquid from the standpoint of cooling efficiency, in particular, water is preferable from the standpoint of ease of handling. An inlet port 25 and an outlet port of the circulation path 24 should preferably extend to the outside of the second chamber via a flexible tube (not shown) and be connected to an outside coolant circulation apparatus (not shown).

Such a hand part 4 is attached to the transfer mechanism 23. The transfer mechanism 23 moves the hand part 4 back and forth freely between the first chamber 2 and the second chamber 3. In FIG. 1, the transfer mechanism 23 has rails 27 (27a, 27b, 27c) and a transfer stage 28 that is transferred over the particular rails 27 by means of motor power. The rails 27 has a first rail part 27a located within the first chamber 2, the second part 27b located within the second chamber 3, and the third rail part 27c located between them. The third rail part 27c is attached to the top of the gate valve 5 and moves in coordination with the opening/closing motion of the gate valve 5 between the first chamber 2 and the second chamber 3, and completes the overall rails 27 by connecting the first rail part 27a with the second rail part 27b while the gate valve 5 is open.

In addition, although the rails 27 and the transfer stage 28 are used to constitute the transfer mechanism 23 in the present embodiment, the transfer mechanism is not limited to such a case, but can be constituted in various other mechanisms, including a single axis or multi-axes robot arm, so long as they are capable of transferring the hand part 4 between the first chamber 2 and the second chamber 3.

Next, let us describe the lifting mechanism that lifts the process object up and down inside the chamber 2 in order to deliver the process object to the hand part 4. As shown in FIG. 1, the lifting mechanism 29 is a mechanism for lifting the substrate 100 and the tray plate 110 up and down. The lifting mechanism 29 can lift the process objects such as the substrate 100 and the tray plate 110 carrying the substrate 100 upwards to separate them from the condition of being placed on the top surface of the hot plate 20 (heating means). Alternatively, after receiving the process object at the condition of being separated from the hot plate 20, it can lower the process object until it is laid on the top surface of the hot plate 20.

Although a case of using a stick-like lifting level to be used as the lifting mechanism 29 in the present embodiment, the invention is not limited to it. So long as it is capable of moving up or downwards while supporting the process object, anything can be used as a lifting mechanism.

Next, let us describe the operation of the solder processing apparatus 1 as constituted in such a manner as described above.

Figure 3:
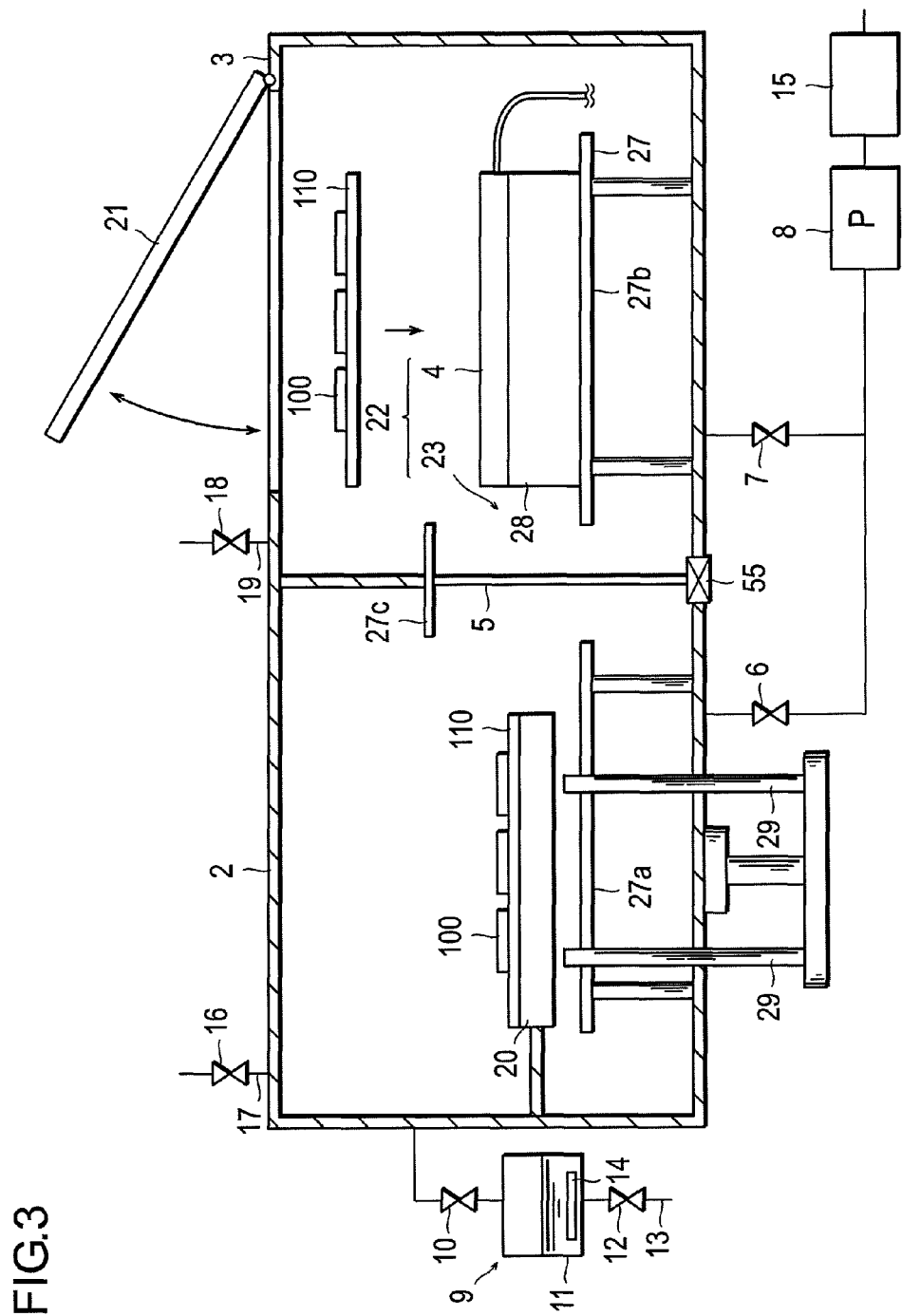
FIG. 3 is a schematic cross-sectional view showing a soldering process by means of the apparatus for soldering process of FIG. 1.

First, the lid 21 of the second chamber 3 is opened as shown in FIG. 3 to load the process object, i.e., the substrate 100, into the second chamber 3. In the present embodiment, a plurality of substrates 100 carried on top of the tray plate 110 is loaded. The loaded tray plate 110 is placed on the top surface of the hand part 4.

Figure 4:
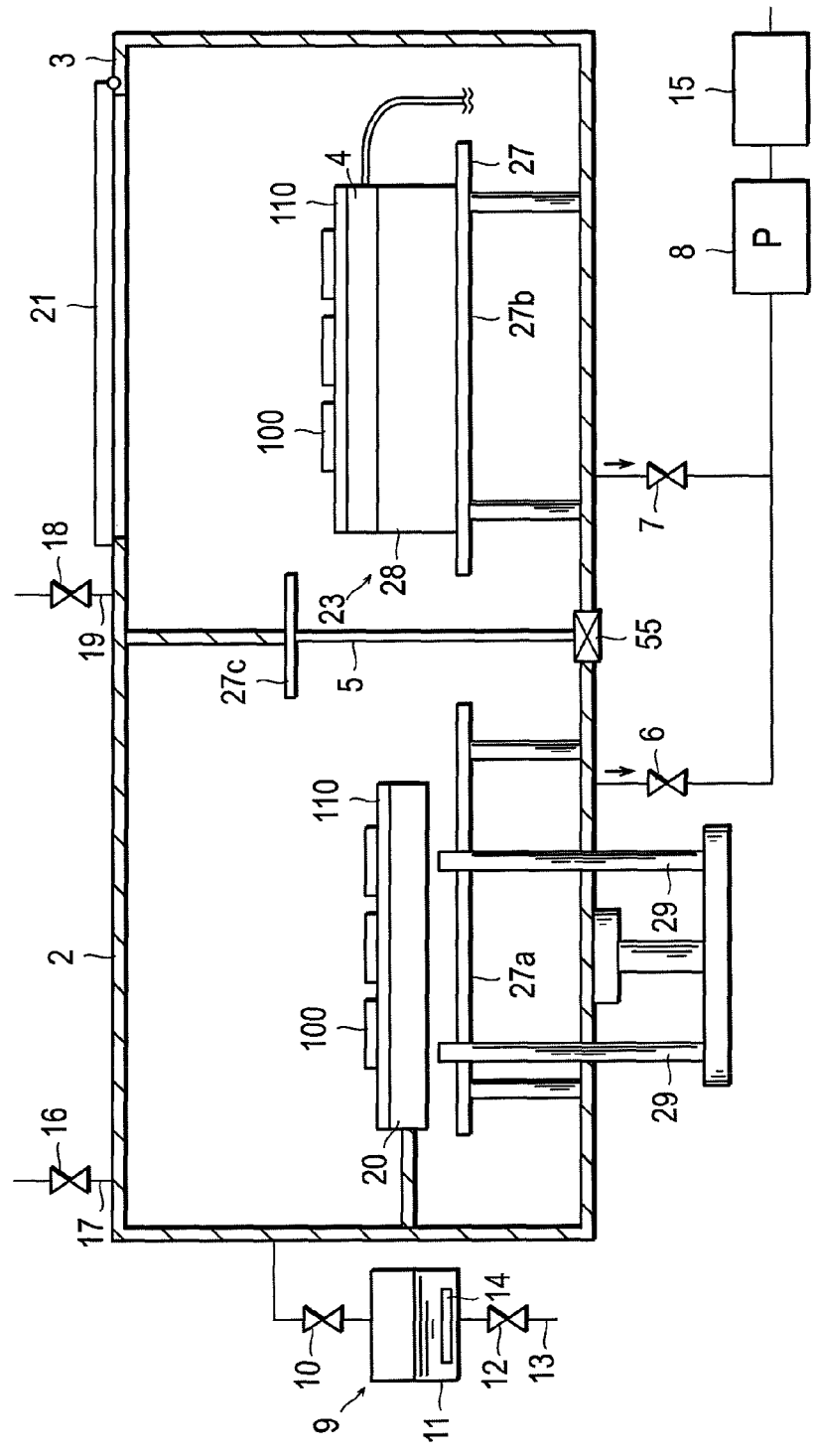
FIG. 4 is a schematic cross-sectional view of a process that follows that of FIG. 3.

Next, the lid 21 is closed as shown in FIG. 4. The valves 6 and 7 open and the exhaust pump 8 is operated to evacuate the first chamber 2 and the second chamber 3. The degree of vacuum can be arbitrarily determined, but should preferably be higher than 10000 Pa ($\approx$80 Torr), or more preferably higher than 10 Pa ($\approx$8$\times 10^{-2}$ Torr). In the present embodiment, the degree of vacuum is chosen to be 6.6 Pa ($5\times10^{-2}$ Torr).

Figure 5:
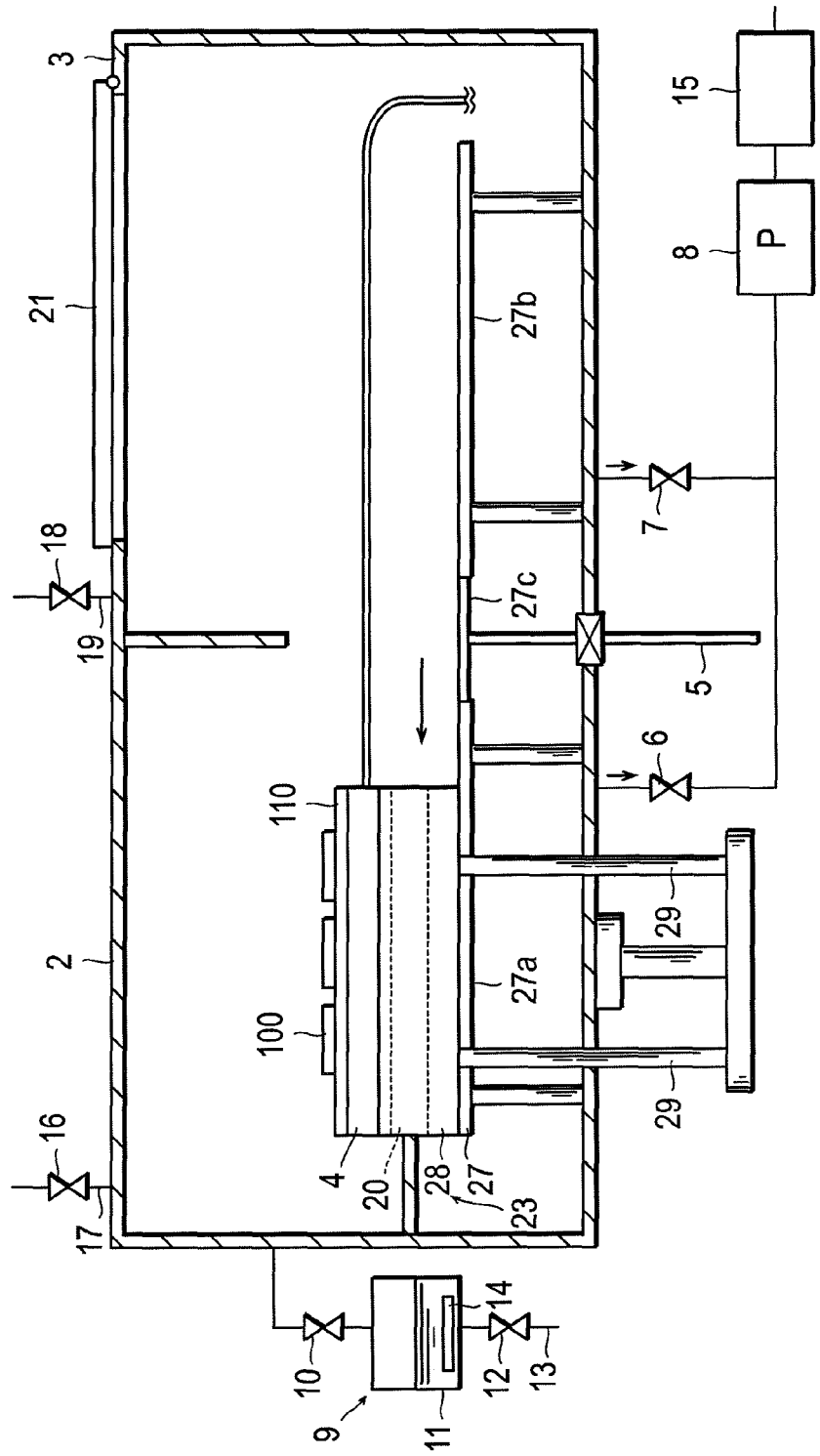
FIG. 5 is a schematic cross-sectional view of a process that follows that of FIG. 4.

Next, the gate valve 5 is opened as shown in FIG. 5. The transfer part 22 transfers the tray plate 110 from the second chamber 3 to the first chamber 2. More specifically, the first rail part 27a, the second rail part 27b, and the third rail part 27c are connected together to complete the rails 27 linked to the opening of the gate valve 5. The motor power of the transfer stage 28 is turned on to transfer the hand part 4 to the first chamber 2 along the rails 27. The transfer stage 28 continues to move until the hand part 4 becomes located above the hot plate 20. For example, the transfer stage 28 is shaped in such a manner to stride over the hot plate 20 so as not to touch the hot plate 20.

Figure 6:
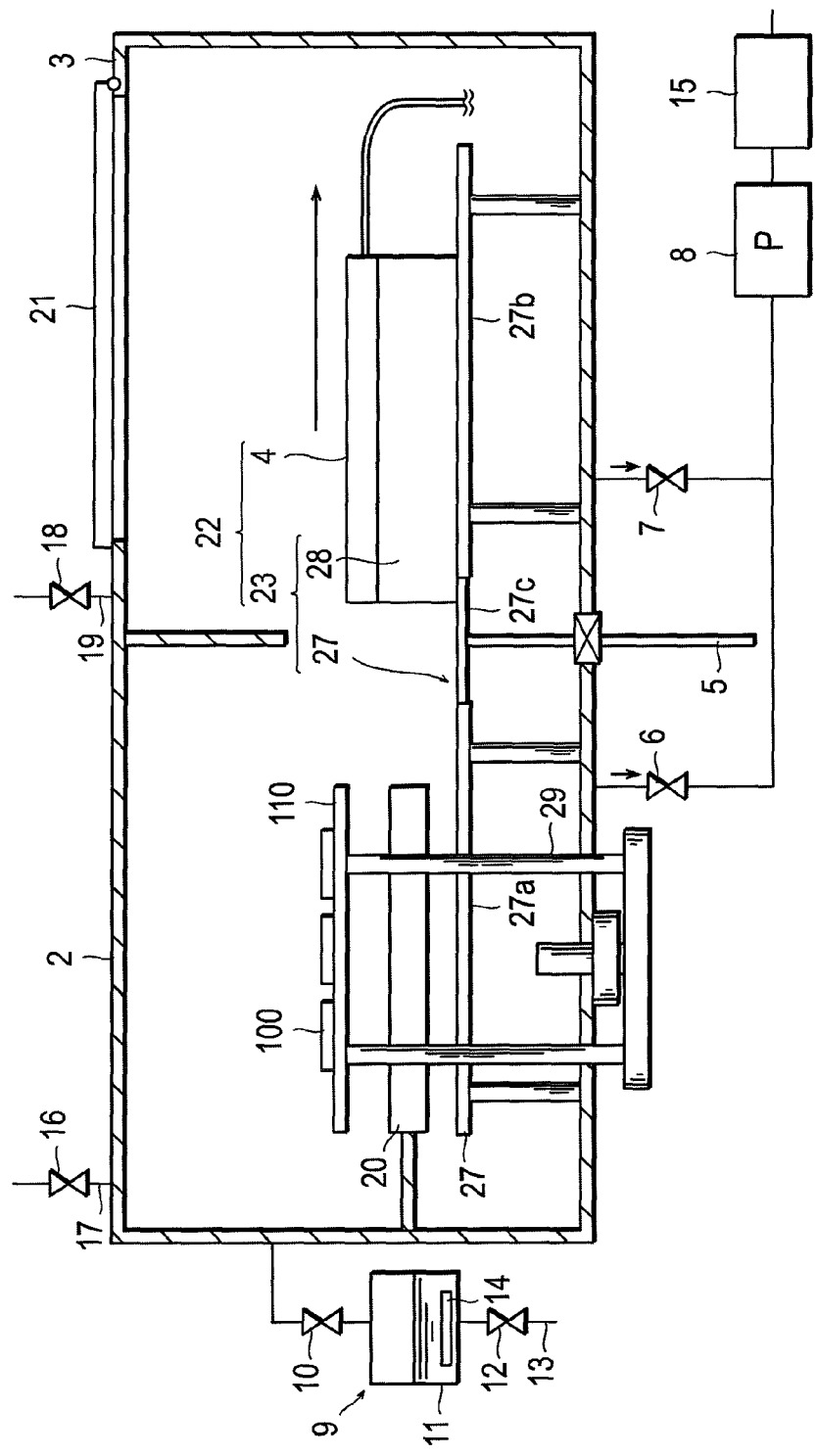
FIG. 6 is a schematic cross-sectional view of a process that follows that of FIG. 5.

Next, as shown in FIG. 6, the lifting mechanisms 29 rises to receive the tray plate 110 located on the hand part 4. After the tray plate 110 is received by the lifting mechanism 29, the transfer stage 28 returns the hand part 4 to the second chamber 3.

Figure 7:
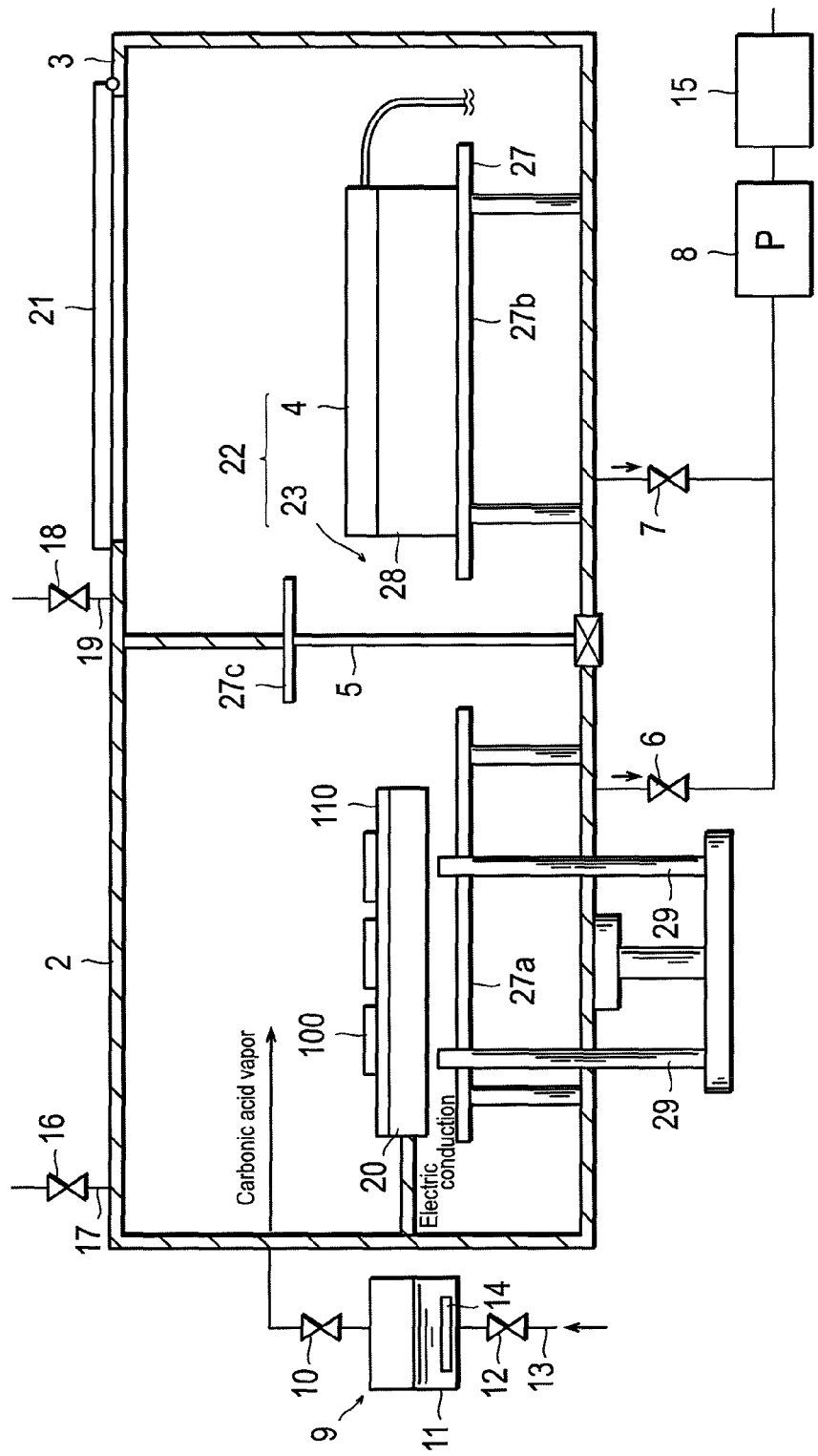
FIG. 7 is a schematic cross-sectional view of a process that follows that of FIG. 6.

Next, as shown in FIG. 7, the lifting mechanisms 29 lowers to place the tray plate 110 on the hot plate 20. At this point, the gate valve 5 is closed and the first chamber 2 and the second chamber 3 become isolated from each other.

In this state, the carbonic acid vapor supply system 9 introduces carbonic acid vapor mixed with carrier gas such as reducing gas like hydrogen or carbon monoxide as well as inert gas like nitrogen into the first chamber 2. More specifically, open the valve 12 to introduce the carrier gas into the sealed container 9 to cause bubbling, and open the valve 10 carefully adjusting the opening to introduce carbonic acid vapor together with the carrier gas into the first chamber 2. Formic acid is used as the carbonic acid in the present embodiment.

The pressure inside the first chamber 2 is increased to a specified pressure with the introduction of the carbonic acid vapor and the carrier gas. More specifically, the pressure of the carbonic acid vapor and the carrier gas is selected from a wide range of several Pa to $1 \times 10^5$ Pa considering the degree of oxidation of the surface of the process object. The pressure of the carbonic acid vapor and the carrier gas can be set by adjusting the degree of opening the valve 10 and the valve 6. In addition, The carbonic acid vapor exhausted by the exhaust pump 8 (exhaust means) is collected by the carbonic acid collection part (collection mechanism) 15 provided or installed on the suction or exhaust side of the exhaust means for collecting vaporized carbonic acid to make it harmless.

In parallel with such an introduction of the carbonic acid vapor and the carrier gas, the substrate 100 is heated by the hot plate 4. When the hot plate 20 is formed from a carbon plate-like member, it is possible to heat the hot plate 20 by running an electric current through the carbon plate-like member 20 itself. With the configuration of heating the carbon plate-like member 200 itself, it is possible to make it less susceptible to carbonic acid so that the corrosion resistance can be improved. The hot plate 4 heats the substrate 100 until it reaches a temperature higher than the melting point of solder of the substrate 100. For example, if the solder is Sn-3.5 Ag (melting point 221° C.), it is heated to a temperature of approximately 230° C.-250° C., which is suitable for soldering. If the solder is Pb-5 Sn (melting point 314° C.), it is heated to a temperature of approximately 330° C.-360° C., which is suitable for soldering. From the standpoint of preventing voids, the carbonic acid vapor should preferably be introduced before the temperature of the substrate 100 reaches the melting point of the substrate 100.

For example, after a specified time (e.g., 5-10 minutes), the current to the hot plate 20 is shut off. After that, close the valves 10 and 12 to stop the supply of the carbonic acid vapor. Next, close the valve 15 to stop the operation of the exhaust pump 8, and open the valves 17 and 19 to introduce nitrogen gas to replace the internal atmospheres of the first chambers 1 and 2 with nitrogen gas.

Figure 8:
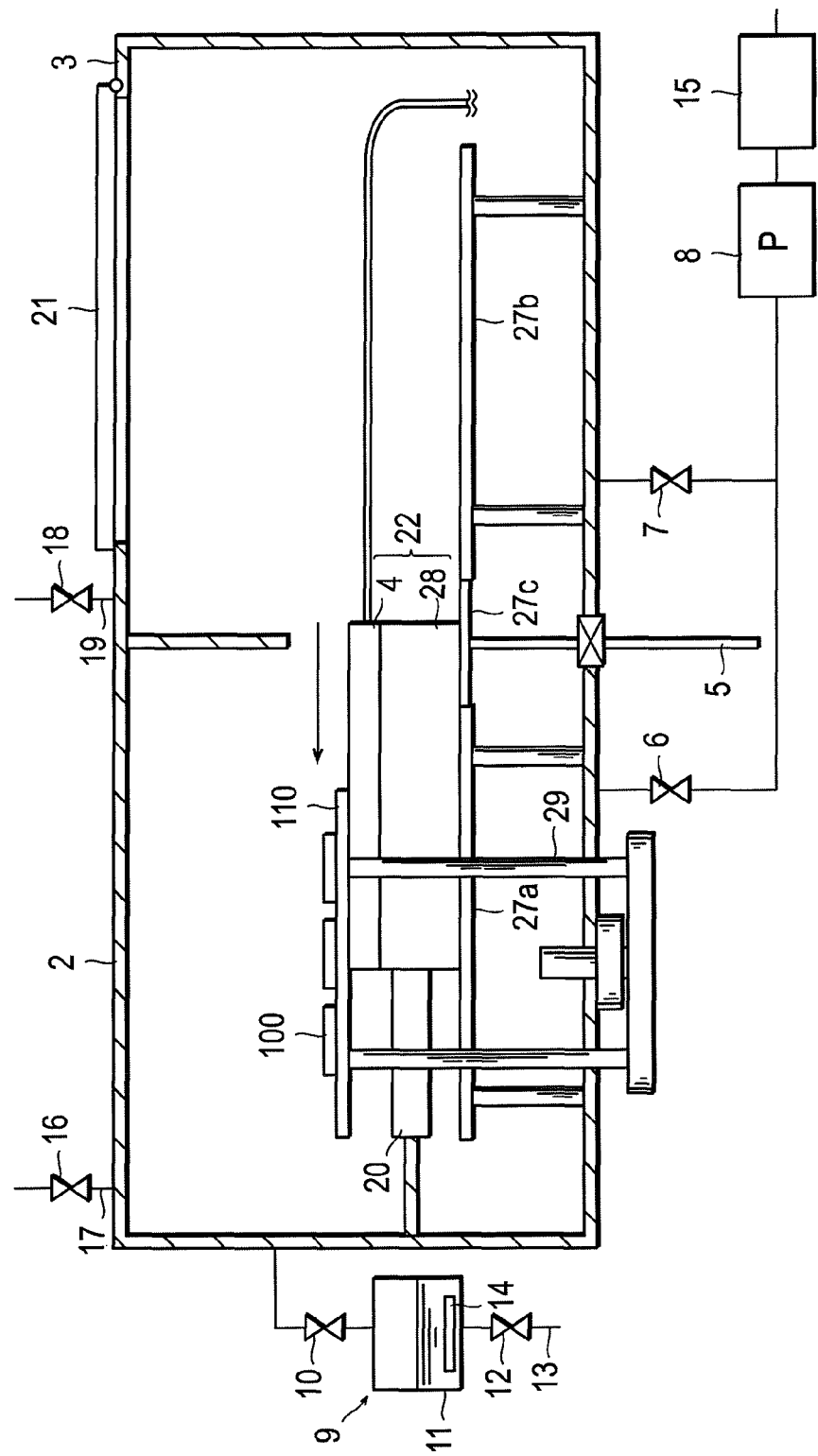
FIG. 8 is a schematic cross-sectional view of a process that follows that of FIG. 7.

Next, the gate valve 5 is opened as shown in FIG. 8. With it, the rail 27 is completed. The lifting mechanism 29 rises inside the first chamber 2. The lifting mechanism 29 separates the tray plate 110 from the hot plate 20 while supporting the tray plate 110 on the hot plate 20. In coordination with it, the transfer stage 28 travels from the second chamber 3 to the first chamber 2 over the rail 27. The transfer stage (transfer means) 28 inserts the hand part 4 between the tray plate 110 and the hot plate 20 while the tray plate 110 (or, the substrate 100 itself if the substrate 100 is a single item) is being separated from the top of the hot plate 20 by means of the lifting mechanism 29. The hand part 4 does to touch the hot plate 20 itself at this time.

Next, the lifting mechanism 29, 29 lowers and delivers the tray plate 110 on the hand part 4. The hand part 4 is provided with the circulation path 24 and water or other kinds of coolant is circulating inside the circulating path 24. Therefore, the cooling of the substrate 100 starts immediately after the tray plate 110 (or substrate 100) is placed on the hand part 4. Moreover, the hand part 4 does not cool the substrate 100 via the hot plate 20 indirectly, but rather cools the substrate 100 itself or the tray plate 110 directly so that it can cool them more rapidly.

Figure 9:
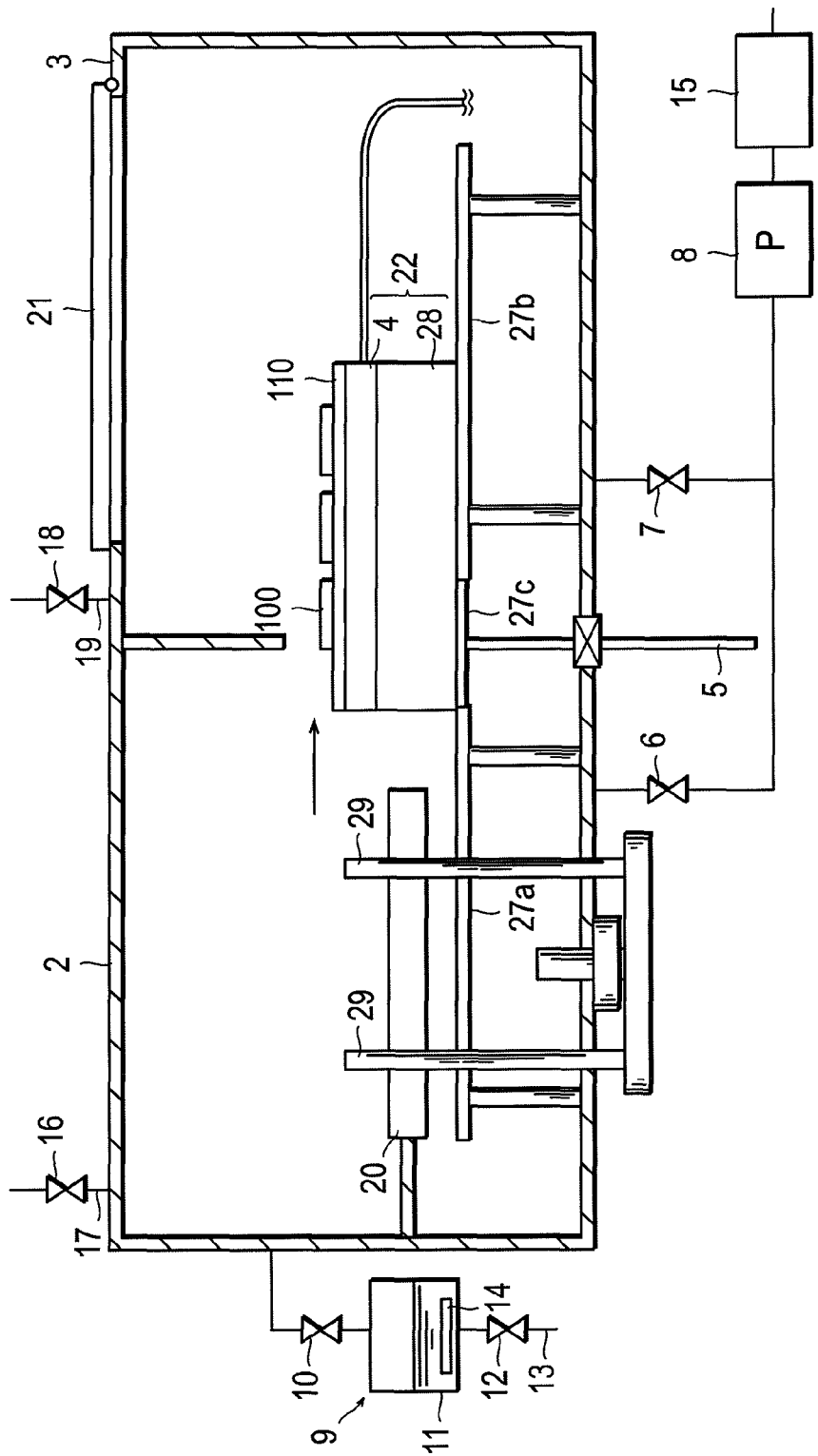
FIG. 9 is a schematic cross-sectional view of a process that follows that of FIG. 8.

Next, as shown in FIG. 9, the transfer part 22 transfers the tray plate 110 from the first chamber 2 to the second chamber 3. In other words, since the hand part 4 that carries the process object in transferring it between the first chamber 2 and the second chamber 3 is also used as a cooling plate, it can continue the forced cooling during the time while it is transferring the process object. When the tray plate 110 returns to the second chamber 3, the gate valve 5 is closed. The substrate 100 whose soldering process is completed is taken out together with the tray plate 110 by opening the lid 21. If there is another substrate 100 to be processed, the system returns to the state shown in FIG. 4, and the tray plate 110 carrying the substrate 100 is loaded on the hand part 4 to repeat the soldering process.

Figure 10:
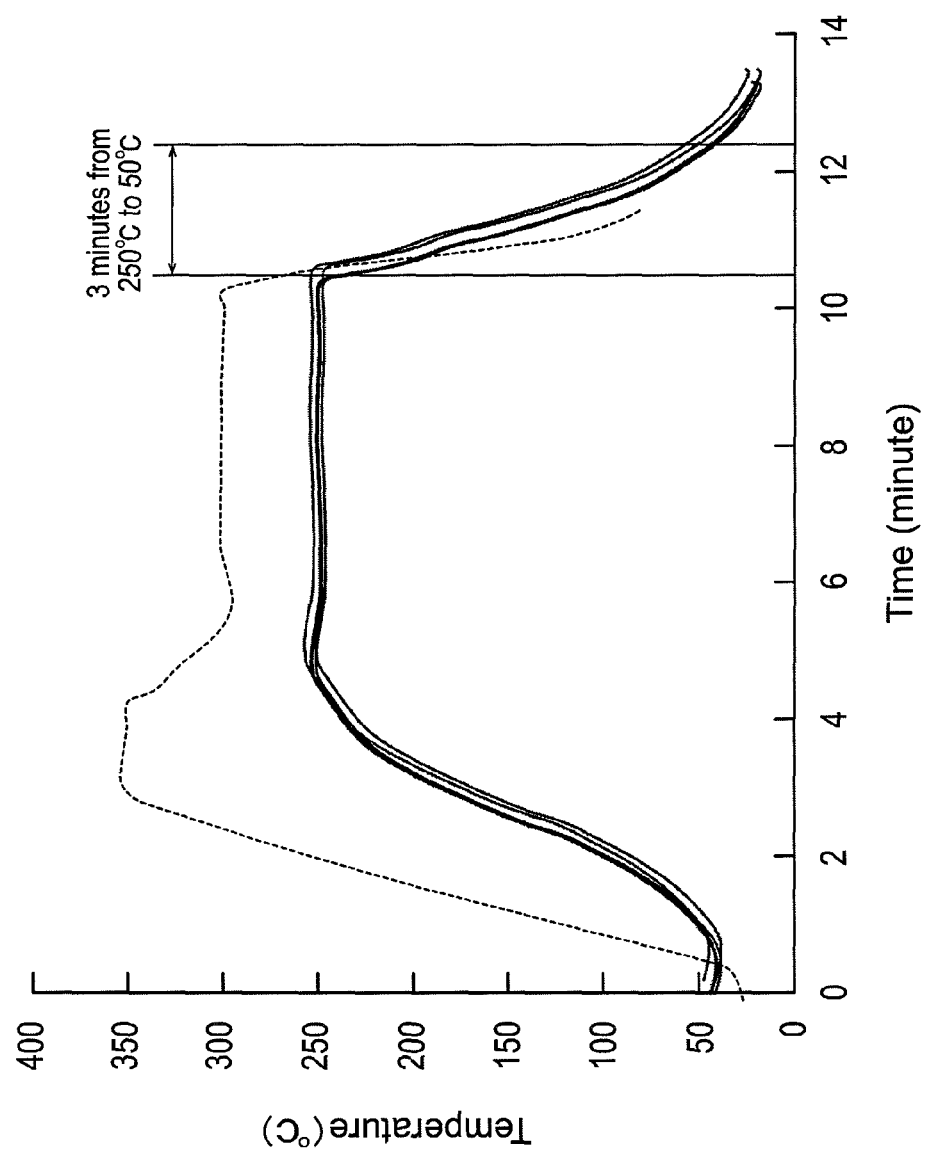
FIG. 10 is a diagram showing temperature rise/fall characteristics by means of the apparatus for soldering of FIG. 1.
Figure 11:
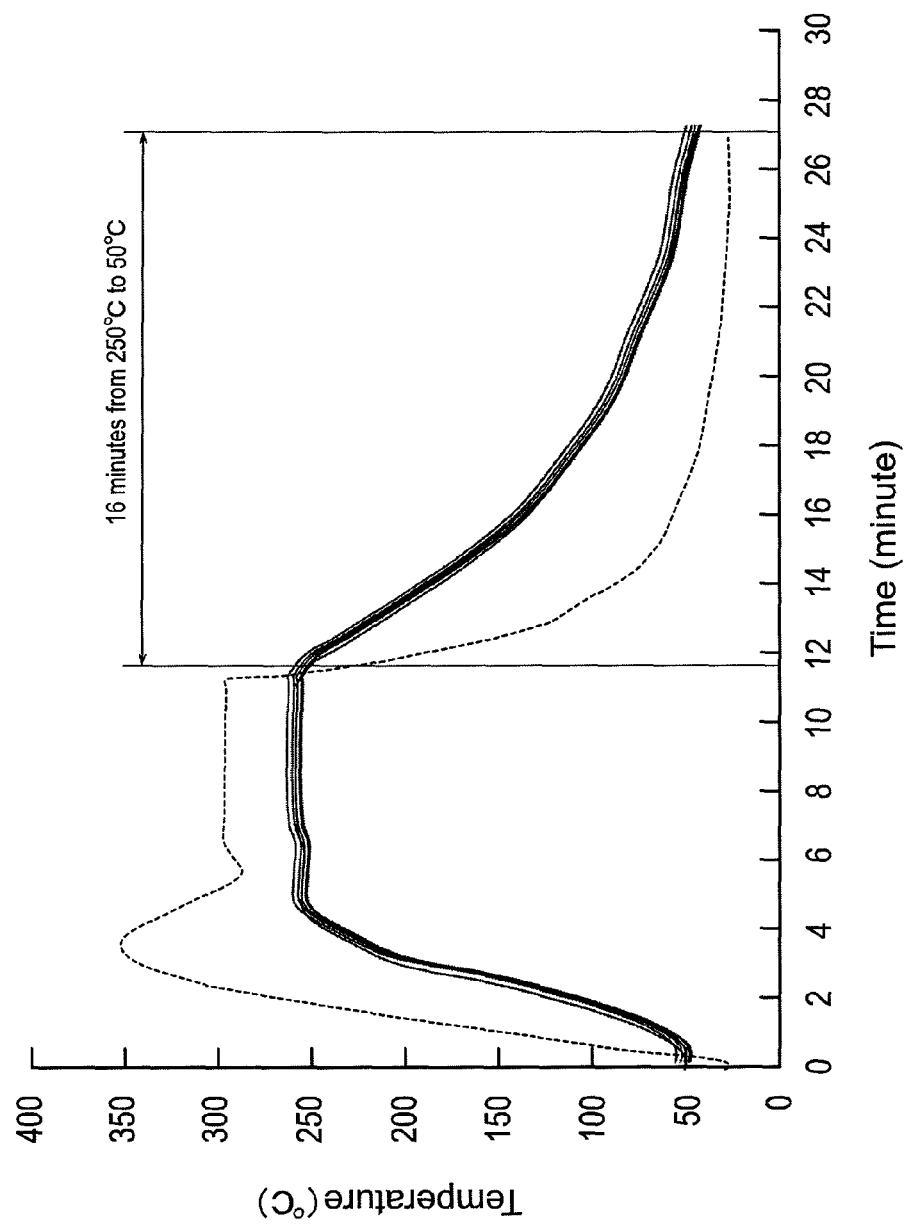
FIG. 11 is a diagram showing temperature rise/fall characteristics by means of a comparative apparatus for soldering.
Figure 12:
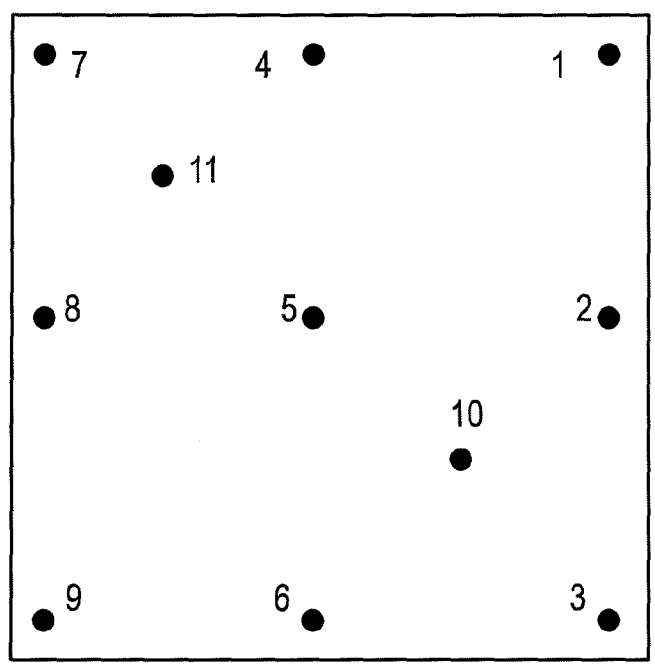
FIG. 12 is a diagram showing the temperature distribution measuring points related to the temperature rise/fall characteristics of FIG. 10 and FIG. 11.
Figure 13:
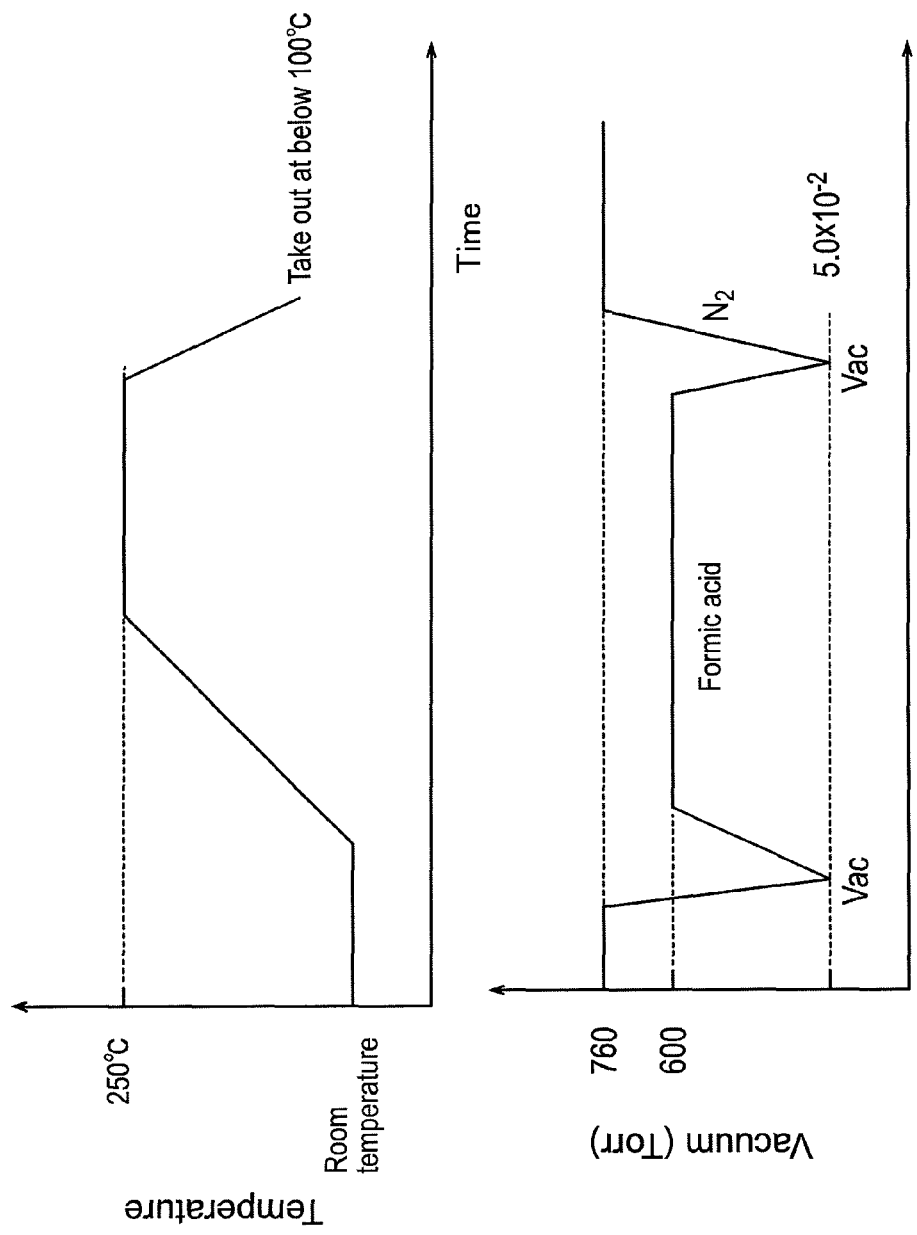
FIG. 13 is a diagram showing the process condition in measuring the temperature rise/fall characteristics of FIG. 10 and FIG. 11.

The effect of using the apparatus for soldering process that does such a process will be described below. FIG. 10 is the temperature rise/fall characteristics of the solder processing apparatus 1 of the present embodiment, while FIG. 11 is the temperature rise/fall characteristics of the solder processing apparatus of the conventional type, provided here for the comparison purpose, wherein the cooling plate is contacting closely with the hot plate equipped with a heater. The measurements were made, as shown in FIG. 12, by measuring temperatures at various points, i.e., point 1 through point 11 of the tray plate 110, placing the tray plate 110 made of carbon with a size of 300×300 mm and a thickness of 5 mm on top of a carbon plate-like hot plate (carbon heater). As the process condition, the same condition shown in FIG. 13 is applied in both the case of the apparatus for soldering process of the present embodiment and in the case of the apparatus for soldering process of the comparative example.

As shown in FIG. 11, in case of the apparatus for soldering process of the conventional type, it took approximately 16 minutes for the temperature of the tray plate 110 to drop from 250° C. to 50° C., while it required only 3 minutes or so for the temperature of the tray plate 110 to drop from 250° C. to 50° C. in case of the apparatus for soldering process of the present embodiment. Also, thanks to the adoption of the carbon plate-like member, the temperature distribution across the measuring points 1 through 11 was uniform as the carbon plate-like member is heated by running a current through the carbon plate-like member itself.

As can be seen from the above, the use of the apparatus for soldering process of the present embodiment eliminates the need of indirectly cooling the process object via the hot plate equipped with the heating means in case of rapid cooling the process object, so that a more efficient rapid cooling becomes possible. In other words, by shortening the temperature lowering time, it increases the work speed and improves the productivity.

Although in the condition described above, it was assumed that the heating is to start from the room temperature, there is no need to cool the hot plate 20 since the hand part 4 that functions as the cooling plate 20 does not touch the hot plate 20 in case of the apparatus for soldering process of the present embodiment. Therefore, it is possible to process the next process object maintaining the temperature of the hot plate 20 itself above the specified temperature, e.g., 70° C.-300° C. Thus, it can also shorten the temperature rising time as needed. In other words, the prior method such as the one described in Patent Document 1 requires to cool the hot plate in order to cool the process object. In other words, although it is necessary to cool the process object from the standpoint of preventing the oxidation of solder on the process object or to prevent the operator from burning, by the prior method, it is necessary to cool even the hot plate. As a consequence, it is not necessary to lower the temperature of the hot plate 20 to the room temperature in case of the apparatus for soldering process of the present embodiment, while it is necessary to lower the temperature of the hot plate to the normal temperature (20±15° C. according to JIS standard) in case of the prior method. Therefore, the heating time can be shortened by raising the temperature of the hot plate 20 that functions as the heating method to 70° C. or higher in advance.

Figure 14:
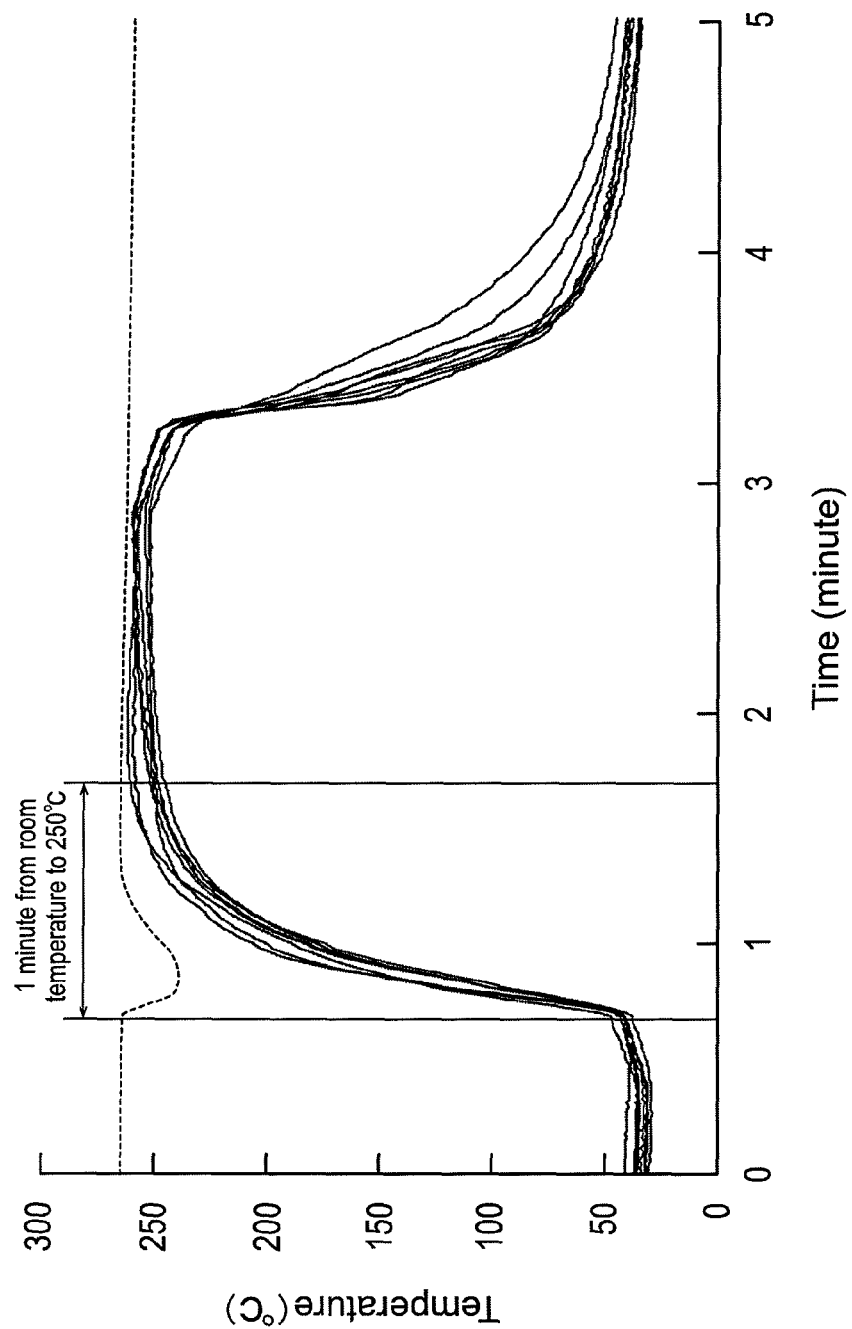
FIG. 14 is a diagram showing the temperature rise/fall characteristics of the apparatus for soldering process of FIG. 1 in case when the process object is handed over while maintaining the heating condition.

FIG. 14 shows the temperature rise/fall characteristics in case the process object is delivered by the hand part 4 that functions as the cooling plate while maintaining the temperature of the hot plate 20 itself at approximately 270° C. The vertical axis of FIG. 14 shows temperature (° C.) and the horizontal axis shows the elapsed time (minute). In FIG. 14, the dotted line represents the temperature of the hot plate 20, and solid lines represent temperatures at various points, i.e., point 1 through point 12, of the tray plate (process object) shown in FIG. 12. In a process as shown in FIG. 14, it is preferable to set the target temperature to 230° C.-250° C. which is suitable for soldering, and it is set to 250° C. in the present embodiment. In the example shown in FIG. 14, the current through the hot plate 20 is maintained to keep it in a heated condition even if no process object is placed on it. The tray plate (process object) is placed on the hot plate 20 while it is maintained at a set temperature of approximately 270° C., higher than the target temperature. The instant when the tray plate is placed on the hot plate 20, its temperature drops to approximately 230° C. for a moment. However, it goes back to the set temperature again because of the temperature control.

As shown in FIG. 14, it is possible to shorten the time needed to raise the process temperature of the target object from the room temperature to the target temperature (250° C.) by delivering the process object while maintaining the temperature of the hot plate 20 in the vicinity of the target temperature of the hot plate 20 (preferably a temperature range higher than the target temperature). In the case shown in FIG. 14, the time that is needed to heat from the room temperature to the target temperature (250° C.) is held within one minute. Compared to a case of controlling the temperature of the hot plate 20 itself up and down as shown in FIG. 11, in which it takes about 5 minutes to raise from the room temperature to the target temperature, the present embodiment can greatly shorten the process time by delivering the process object while maintaining the temperature of the hot plate 20 approximately around the target temperature (preferably higher than the target temperature) as shown in FIG. 14.

Moreover, the temperature of the hot plate 20 does not overshoot if the process object is delivered while maintaining the temperature of the hot plate 20 itself at a vicinity of the target temperature (preferably higher than the target temperature) as shown in FIG. 14, in contrast to the case of raising and lowering the temperature of the hot plate 20 itself as shown in FIG. 11. Therefore, its control is easier.

As can be seen from FIG. 14, the apparatus for soldering process of the present embodiment eliminates the need of indirectly cooling the process object via the hot plate equipped with the heating means in case of rapidly cooling the process object, so that a more efficient rapid cooling becomes possible. In other words, by shortening the temperature lowering time, it increases the work speed and improves the productivity.

As can be seen above, the apparatus for soldering process of the present embodiment has the following effects:

(1) The temperature lowering time can be shortened in case of rapidly cooling the process object compared to cooling the process object indirectly via the hot plate equipped with the heating means.

(2) The next process object can be processed while maintaining the temperature of the hot plate 20 itself at a high level. Therefore, it can also shorten the temperature rising time as needed.

(3) Since the hand part 4 which is a component of the transfer means can be used as a cooling plate, the transfer time can be utilized as a forced cooling period. Also, there is no need for providing the transfer system and the cooling system as two independent machine components.

(4) Since the carbon plate-like member is used as the hot plate 20, the carbon plate-like member can be heated by running a current through the carbon plate-like member itself, so that the corrosion resistance can be improved.

Second Embodiment

In the first embodiment above, a case of using the hand part 4 having a circulation path through which the cooling liquid is circulated. In the second embodiment, the hand part 4 does not have a circulation path through which the cooling liquid is circulated.

Figure 15:
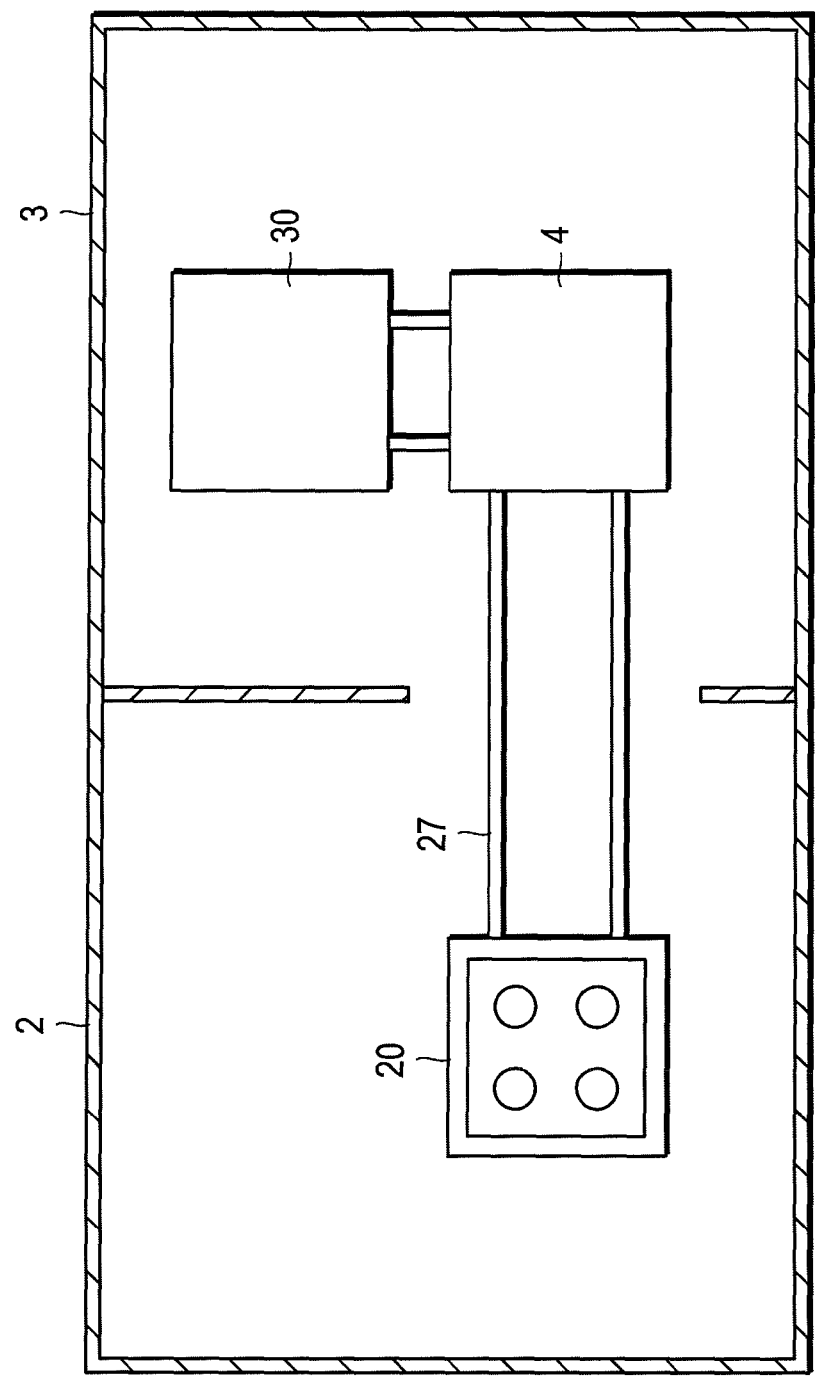
FIG. 15 is an internal top view of an apparatus for soldering process according to a second embodiment.

FIG. 15 shows a plan view of the apparatus for soldering process according to the second embodiment seen from above. The description of the configuration which is similar to that of the first embodiment is omitted. The hand part 4 of the apparatus for soldering process according to the present embodiment is preferably made of a material with a high thermal conductivity such as copper (398 W·m$^{-1}$·K$^{-1}$), and more preferably made of a material with a thermal conductivity higher than 100 W·m$^{-1}$·K$^{-1}$. In the present embodiment, the hand part 4 itself does not have a circulation path through which the cooling liquid is circulated.

As is shown in FIG. 15, a cooling part (forced cooling means) 30 that force-cools the hand part 4 is provided inside the second chamber 3. The cooling part 30 can be constantly cooled by means of a cooling path through which cooling liquid is circulated as in the case of the hand part of the first embodiment, or can be cooled by air cooling or other means as the Peltier cooler.

The transfer mechanism (FIG. 15 only shows the rail part 27) can not only move the hand part 4 back and forth freely between the first chamber 2 (especially the hot plate 20) and the second chamber 3, it moves the hand part 4 abutting upon the cooling part 30.

The apparatus for soldering process of the present embodiment operates as follows. The moving mechanism causes the hand part 4 to move above the cooling part 30 and to abut against the cooling part 30. Abutting against the cooling part 30, the hand part 4 is force-cooled. The moving mechanism then moves the hand part 4 away from the cooling part 30. The hand part 4 moves from the second chamber 3 to the first chamber 2, receives the substrate 100 or the tray plate 110 on which the substrate 100 is carried in the first chamber 2, and transfers the process object by carrying the process object on it from the first chamber 2 to the second chamber 3. After the hand part 4 is heated to a high temperature while carrying the heated process object on it, the hand part 4 is moved onto the cooling part 30 to be force-cooled. In other words, after taking out the heated process object from the first chamber 2, the hand part 4 is force-cooled by the cooling part 30 at least once until taking out the heated process object from the first chamber 1. Although the hand part 4 can be used to transfer the newly loaded process object from the second chamber 3 to the first chamber 2 in order to heat it, there is no need to use the hand part 4 that is to be used as a cooling plate as well for loading it from the second chamber 3 to the first chamber 2, so that it is also possible to configure in such a way as to have a separate hand for loading and the hand part 4 to be used as a cooling plate as well can be continuously force-cooled by the cooling part 30 in preparation for the next take out process even during the loading process executed by the other hand part. Since the receiving and the transfer of the process object here is similar to that of the first embodiment which was described referring to FIG. 8 and FIG. 9, detail descriptions are omitted.

As the apparatus for soldering process of the present embodiment transfers the process object using the hand part 4 after force-cooling it, it provides an effect of being able to utilize the transfer time as the forced cooling period. Therefore, it provides a similar effect as the first embodiment described above. There is no need to circulate the cooling liquid through the hand part 4 itself, so that there is no need to provide tubes for the cooling liquid in the moving parts. Therefore, equipment maintenance is easy in this case.

VARIANT EXAMPLE

In the heating process of the first embodiment, (a) evacuate the first chamber 2 and the second chamber 3, and (b) while mixing the carrier gas with carbonic acid vapor and introducing in the first chamber, heat the substrate in the atmosphere of the carrier gas and carbonic acid, and melt the solder while conducting the reduction. Also, in the cooling process of the first embodiment, after (c) exhausting the mixed gas of the carrier gas and carbonic acid vapor from the first chamber 2, and (d) replacing the inside of the first chamber 2 and the second chamber 3 with nitrogen gas, the process object is transferred from the first chamber 2 to the second chamber 3 in the nitrogen atmosphere. Also, a case of constantly raising the temperature during the heating process was described with reference to FIG. 13.

Figure 16:
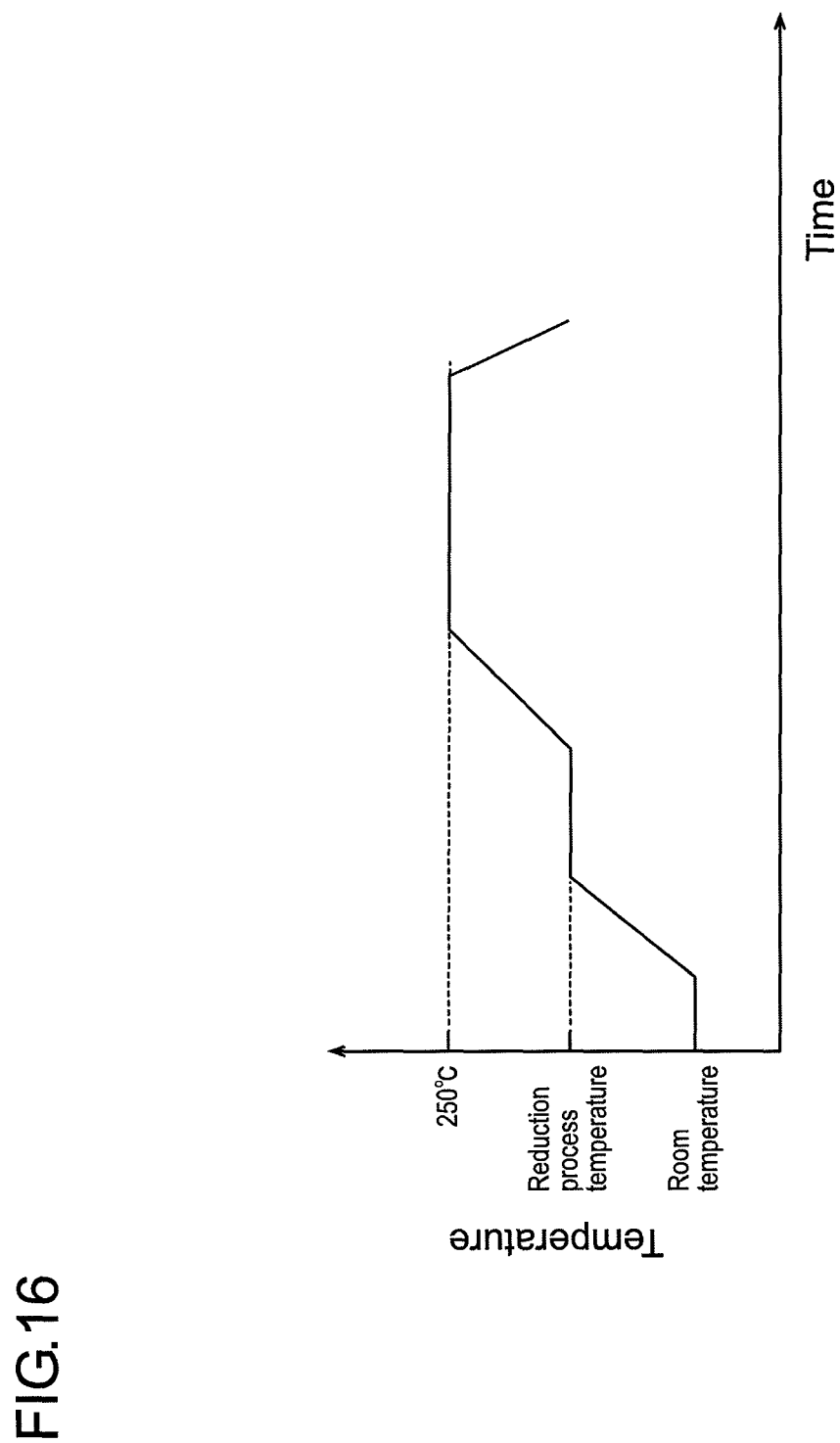
FIG. 16 is a diagram showing an example of the temperature rise/fall characteristics of a variant case of the present invention.

However, the present invention is not limited to this case. The hot plate can also be configured in such a manner, as shown in FIG. 16, as to maintain the process object at a reduction process temperature below the melting point of solder (preferably 130° C. or higher, more preferably 150° C. or higher) for a few minutes. Maintaining such a reduction process temperature can make it possible to sufficiently execute the reduction process of solder. According to the present invention, the hand part 4 that functions as the cooling plate does not touch the hot plate 20 and the hot plate 20 does not need to be cooled even in case of maintaining the reduction process temperature for promoting the reduction process. Therefore, it is possible to keep the temperature of the hot plate 20 itself at the reduction process temperature.

Also, it is not necessarily required to raise its temperature in the carbonic acid atmosphere prior to the reduction process. For example, it can be heated in vacuum or in an atmosphere of inactive gas, such as nitrogen, until it reaches the reduction process temperature. In this case, carbonic acid can be introduced into the first chamber 2 after reaching the reduction process temperature. It is advantageous to do so in raising the temperature in the inactive gas as it accelerates the temperature rising speed.

Moreover, it was described in the first embodiment that the atmosphere of the first chamber 2 should be evacuated prior to convert it to the mixture of the carrier gas and carbonic acid vapor. It is surely desirable to evacuate the atmosphere of the first chamber 2 in order to reduce the oxygen amount, but this evacuation process can be omitted if necessary. For example, it is possible to replace the atmosphere of the first chamber 2 sufficiently with an inert gas such as nitrogen gas, and introduce carbonic acid vapor into the chamber when the temperature reaches the level high enough to promote the reduction process. In this case, the apparatus for soldering process is equipped with, in place of the evacuation means, an inert gas supply means to supply an inert gas into the first chamber 2 and/or into the second chamber 3.

Moreover, the invention is not limited to a case of replacing the carbonic acid atmosphere in the first chamber 2 and the second chamber 3 with nitrogen gas after discharging it and lowering the temperature of the process object in the nitrogen gas atmosphere before taking it out as described in the first embodiment. Although it is surely preferable to lower the temperature of the process object prior to taking it out from the standpoint of expediting the temperature lowering speed, the temperature can be lowered in vacuum for the purpose of avoiding the oxidation of the surface, if necessary, or can be so configured to move the process object from the first chamber 2 to the second chamber 3 without exhausting the carbonic acid atmosphere.

The above descriptions of the embodiments as well as a variation of the present invention are not in any way intended to limit the present invention.

For example, although the substrate to be soldered was described as an example of the process object and the apparatus for soldering process was described as an example of the apparatus for thermal melting process, the present invention is not limited by those examples. The present invention can be applied to any thermal melting process of solder concerning any process object including solder. For example, it can be applied to a solder ball forming apparatus for forming solder balls by means of melting solder, or any other apparatus for thermal melting process. The substrate here is not limited to the substrate to be soldered.

Although the apparatus for thermal melting process having a first chamber and a second chamber was described in the above, the invention is not limited to it. With respect to the apparatus for thermal melting process for conducting a thermal melting process on process objects including solder in an atmosphere containing carbonic acid vapor, the hand part of the transfer means that is used to take out the process object from the first chamber and transfer it can be used as a cooling plate as well. The apparatus for thermal melting process can have more than three chambers. For example, it can have a loading side chamber for loading the process object prior to heating into the first chamber, and a discharge side chamber for removing the process object from the first chamber after the heating process. In this case, the hand part for transferring the process object after heating among a plurality of hand parts can be used as a cooling plate.

That is to say, the present invention is applicable to any apparatus for thermal melting process that thermally melts objects including solder in an atmosphere containing carbonic acid vapor, and that has a hand part for transferring the thermally melted process object which is used as a cooling plate as well.

Any parts of the present invention can be added, deleted, or modified within the scope of the claims.

The invention claimed is:

1. A thermal melting apparatus for conducting a thermal melting process on process objects including solder in an atmosphere containing carbonic acid vapor, wherein, said apparatus comprises:
   a first chamber for conducting the thermal melting process on the process object including solder;
   a second chamber connected to the first chamber via a valve capable of opening and closing;
   a carbonic acid supply means for supplying the carbonic acid to the first chamber;
   a heating means provided in the first chamber for heating the process object;
   a transfer means, which is movably provided between the first chamber and the second chamber, the transfer means including a hand part on which the process object is placed, the hand part having an internal circulation path or an external circulation path through which a cooling medium can flow, wherein the hand part is also used as a cooling plate to cool the process object; and
   a forced cooling means for forcedly cooling the hand part.

2. The apparatus of claim 1, wherein the hand part is provided with a circulation path for circulating a cooling liquid.

3. The apparatus of claim 1 wherein said forced cooling means force-cools the hand part abutted thereto and provided in the second chamber, and wherein the hand part cooled by the forced cooling means carries the process object to transfer it from the first chamber to the second chamber.

4. The apparatus of claim 3, wherein the transfer meanings comprise a transfer mechanism that transfers the hand part freely forward or backward.

5. The apparatus of claim 4, wherein the heating means is a carbon plate-like member that carries the process object, and heats the process object by apply electric current to the carbon plate-like member.

6. The apparatus of claim 5 further comprising:
   a lifting mechanism that raises or lowers the process object placed on the heating means, wherein the hand part is inserted between the process object and the heating means after the process object is lifted of the top surface of the heating means by the lifting mechanism.

7. The apparatus of claim 6, wherein the carbonic acid supply means further comprises:
   a container for storing carbonic acid liquid; and
   a supply tube for communicating with the container and for supplying carrier gas to be mixed with carbonic acid vapor generated in the container.

8. The apparatus of claim 6, wherein the carbonic acid supply means further comprises:
   a supply tube to supply the carbonic acid liquid to the first chamber; and
   a carbonic acid heating means that is provided in the first chamber to cause the carbonic acid liquid to evaporate.

9. The apparatus of claim 8 further comprising:
   one or more exhaust means for reducing the pressures in the first chamber and the second chamber.

10. The apparatus of claim 9 further comprising:
    a collection mechanism provided or installed on the suction side or the exhaust side of the exhaust means to collect the evaporated carbonic acid.

11. The apparatus of claim 8 further comprising:
    an inert gas supply means for supplying inert gas in the first chamber or the second chamber.

12. The apparatus of claim 11, wherein the process object is a substrate to be soldered, and the thermal melting process is a soldering process.

13. The apparatus of claim 12, wherein the substrate to be soldered is a pair of chips including at least a chip where a plurality of solder bumps are formed on the surface thereof, and the soldering process is a flip-chip bonding process for jointing the pair of chips via the solder bumps themselves or via the solder bumps with electrodes.

14. The apparatus of claim 13, wherein the substrate consists of a chip and a wafer where a plurality of solder bumps are formed on the surface thereof, or a plurality of wafers where a plurality of solder bumps is formed on the surface thereof.

15. The apparatus of claim 8, wherein the hand part, which is also used as the cooling plate, is provided there to carry the process object without touching the heating means; and the temperature of the heating means is raised to 70° C. or higher in advance in order to shorten the heating time.

* * * * *